US006577131B2

(12) United States Patent
Shepeck et al.

(10) Patent No.: US 6,577,131 B2
(45) Date of Patent: Jun. 10, 2003

(54) MOTOR TERMINAL FIXTURE

(75) Inventors: Matthew A. Shepeck, Holmen, WI (US); Brenda K. Bricco, Minnesota City, MN (US); Brady J. Moroney, La Crescent, MN (US)

(73) Assignee: American Standard International Inc., New York, NY (US)

( * ) Notice: Subject to any disclaimer, the term of this patent is extended or adjusted under 35 U.S.C. 154(b) by 0 days.

(21) Appl. No.: 09/972,372

(22) Filed: Oct. 5, 2001

(65) Prior Publication Data
US 2003/0067305 A1 Apr. 10, 2003

(51) Int. Cl.[7] .......................... F02P 17/00; G01R 31/34; H01H 31/04
(52) U.S. Cl. ........................ 324/402; 324/772; 324/538; 324/378
(58) Field of Search ................................ 324/538, 537, 324/754, 755, 756, 761, 772, 555, 138.1, 378, 402; 310/71, 89, 68; 439/217, 218, 224; 70/408, 492

(56) References Cited

U.S. PATENT DOCUMENTS

| 4,146,085 A | | 3/1979 | Wills ........................... 165/11 |
|---|---|---|---|
| 4,357,815 A | * | 11/1982 | Kleefeldt et al. .............. 70/337 |
| 4,394,549 A | | 7/1983 | Dennis .......................... 200/16 |
| 4,429,935 A | | 2/1984 | Lamb et al. ................... 339/32 |
| 5,563,489 A | | 10/1996 | Murry .......................... 318/778 |
| 5,712,569 A | * | 1/1998 | Canu et al. .................. 324/538 |
| 6,040,646 A | * | 3/2000 | Peters .......................... 310/71 |

* cited by examiner

Primary Examiner—N. Le
Assistant Examiner—Donald M Lair
(74) Attorney, Agent, or Firm—William J. Beres; William O'Driscoll

(57) ABSTRACT

A motor test fixture for connection to motor terminal lugs. The fixture includes a housing including a plurality of external apertures positioned and formed to enclose the motor terminal lugs; an aperture in the housing; a chamber within the housing having a first end open to the aperture; and a slide bar moveably located in the chamber and moveable between at least a first position and a second position. The fixture also includes a plurality of plates moveably mounted in the housing to move between a motor lug engagement position and a motor lug disengagement position; and a plurality of plate motivators. Each plate motivator is arranged on the slide bar to engage a respective one of the plates and, when the slide bar is in the first position, to motivate the respective plate to the lug disengagement position and, when the bar is in the second position, to motivate the respective plate to the lug engagement position. The motor test fixture also preferably includes a polarity bar.

24 Claims, 4 Drawing Sheets

MOTOR TERMINAL FIXTURE

BACKGROUND OF THE INVENTION

The present invention is directed to motor terminal fixtures used in the testing of motor terminal connections.

Multi-phase motors such as those used in compressors require three phases of line voltage to be terminated across the motor coils of the compressor, typically using either three or six terminal connections in doing so. The intermediate wiring between a control panel and the compressor is housed in conduit and routed through various unit configurations. Additionally, the starter contacts are integral to the required wiring. The final assembly wiring and routing of the compressor line voltage must be verified as correct prior to shipping the unit.

The present invention provides a motor terminal test fixture for use in verifying the correctness of the final assembly wire and routing.

SUMMARY OF THE INVENTION

It is an object, feature and advantage of the present invention to solve the problems of the prior art.

It is an object, feature and advantage of the present invention to provide a motor terminal test fixture which is applied without error to terminals being tested. It is a further object, feature and advantage of the present invention to eliminate the requirement that a technician secure independent "alligator" style wiring harnesses or the like to the motor terminals. It is a further object, feature and advantage of the present invention to eliminate errors caused by incorrect installation of these alligator style clips.

It is an object, feature and advantage of the present invention to provide a motor terminal test fixture which includes strain relief cabling within the housing to prevent internal wear and to provide clamp release fittings for each terminal log to provide a secure fitting. It is a further object, feature and advantage of the present invention to provide press plates for each terminal which are individually spring loaded to maintain contact under vibration or lug position variances. It is a further object, feature and advantage of the present invention to provide a lever arm on the fixture to allow an easy-off/easy-on clamp by a technician. It is a further object, feature and advantage of the present invention to provide a polarity bar to ensure that inverted connections are not possible. It is another object, feature and advantage of the present invention to provide a quick connect/disconnect fixture which allows the fixture to be quickly and easily attached and quickly and easily replaced if necessary. It is a still further object, feature and advantage of the present invention to provide a test fixture which is compatible with both "across the line" and "wye-delta" starter types. It is yet another object, feature and advantage of the present invention to provide a test fixture which is easily disassembled to make repairs if necessary. Finally, it is an object, feature and advantage of the present invention to provide a motor tester which uses a simple voltage divider circuit to measure the resulting load at the motor terminals.

The present invention is directed to a motor test fixture for connection to motor terminal lugs. The fixture comprises: a housing including a plurality of external apertures positioned and formed to enclose the motor terminal lugs; an aperture in the housing; and a chamber within the housing having a first end open to the aperture. The fixture also comprises a slide bar moveably located in the chamber and moveable between at least a first position and a second position; a plurality of plates moveably mounted in the housing to move between a motor lug engagement position and a motor lug disengagement position; and a plurality of plate motivators. Each plate motivator is arranged on the slide bar to engage a respective one of the plates and, when the slide bar is in the first position, to motivate the respective plate to the lug disengagement position and, when the bar is in the second position, to motivate the respective plate to the lug engagement position.

The present invention is also directed to a slide bar. The slide bar comprises a longitudinally extending bar; and a plurality of plate motivators integrally formed in the bar where each plate motivator includes a sloped portion.

The present invention is further directed to a motor test fixture system. The system comprises a plurality of motor terminal lugs providing electrical connection to a motor and motor start contactors; a housing including a plurality of external apertures positioned and formed to enclose the motor terminal lugs; and a longitudinal chamber arranged within the housing and having a first chamber end and a second chamber end. The system also comprises a longitudinal slide bar arranged in the chamber and having a first end and a second end. The slide bar is moveable to a first position near the first chamber end and a second position nearer the second chamber end. The system further comprises a plurality of plates moveably positioned in the housing to move between a motor lug engagement position where the plates respectively contact a motor lug and a motor lug disengagement position where the plates do not contact the respective motor lug; and a plurality of plate motivators. Each plate motivator is arranged on the slide bar to engage a respective one of the plates when the slide bar is in the first position and to motivate the respective plate to the lug disengagement position.

The present invention still further provides a method of connecting a motor test fixture to motor terminal lugs. The method comprises the steps of: placing external apertures in the motor terminal test fixture over a plurality of motor terminal lugs; slideably moving a slide bar within a chamber in the test fixture from a first position to a second position; responsive to the slide bar movement, sliding a plurality of plates moveably mounted in the housing from a motor lug disengagement position to a motor lug engagement position; and providing a plurality of plate motivators associated with each of said plurality of plates respectively urging the respective plate to the lug disengagement position when the slide bar is in the first position and motivating the respective plate to the lug engagement position when the slide bar is in the second position.

DETAIL DESCRIPTION OF THE PREFERRED EMBODIMENT

Figure 1:
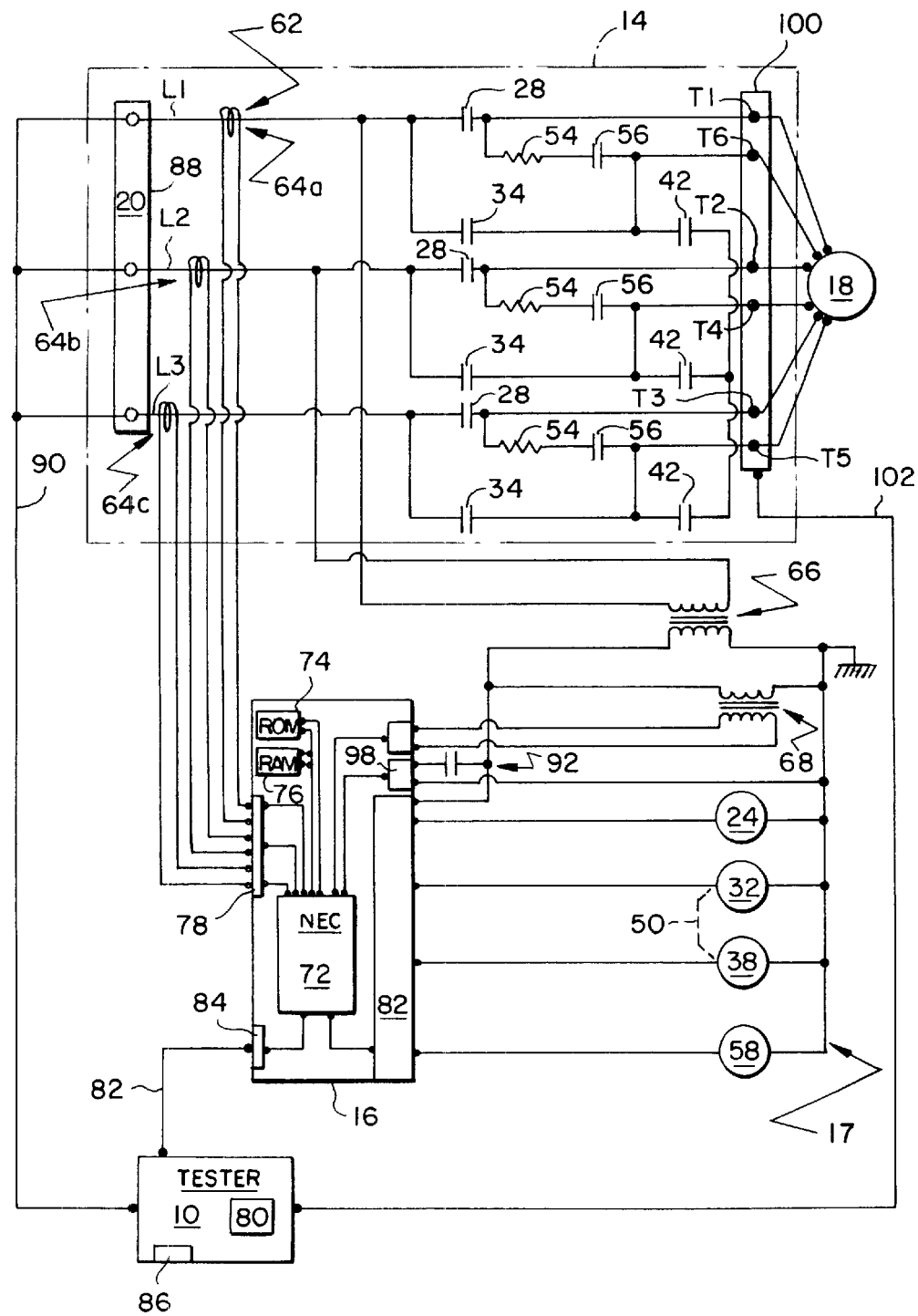
FIG. 1 is a schematic drawing of the motor, associated controlling circuitry, a starter control module, and the present invention.

Referring to FIG. 1, a tester means 10 is provided for detecting faults in motor terminal connections 14. The tester means 10 is operably connected to and controlling a microprocess based starter control module 16 which is programmed to control the operation of a starter circuit 17 and to perform diagnostics to detect failed conditions in the starter circuit 17. More specifically, the control module 16 controllably energizes contactors in the starter circuit 17 and samples for the presence and absence of current flow in motor windings to detect fault conditions in the contactors. It is desirable to also test the connectors of the starter circuit 17. Details of operation of the module 16 and the circuit 17 are well-known in systems sold by The Trane Company, a Division of American Standard Inc. under the trademarks CentraVac™ and Series R™ and as shown in U.S. Pat. 5,563,489 to Murry which is commonly owned with the present invention and hereby incorporated by reference. Further details of the control scheme for testing motor contacts and their integrity can be derived therein.

In FIG. 1, the tester means 10 is illustrated in connection with a closed transition wye-delta starter circuit which energizes a three-phase motor 18 from a three-phase power source 20. Although the diagnostic means 10 is described with a wye-delta starter circuit, it should be appreciated that the diagnostic means 10 is suitable for use with other starter circuits having contactors connecting motor terminals to a power source.

The three-phase motor 18 includes three sets of phase windings (not shown), each of which terminates in respective first and second electrical terminals. The motor terminals have been labeled T1, T2, T3, T4, T5 and T6, where T1 and T4 represent the first and second terminals of the first motor phase, T2 and T5 represent the first and second terminals of the second motor phase and T3 and T6 represent the first and second terminals of the third motor phase. A person of ordinary skill in the art will readily recognize the terminal alternatives to the six terminal embodiment of this application including three terminal embodiments.

The wye-delta starter circuit 17 is responsive to control signals produced by the control module for connecting the motor terminals T1–T6 to power lines L1, L2, L3 from the three-phase power supply. For this purpose, the starter circuit 17 includes a starter contactor 24 in the form of a three pole contactor. The contacts 28 of the starter contactor 24 are connected between the motor windings first terminals T1, T2, T3 and the power supply 20. The starter contactor 24 is adapted to receive a start signal from the control module 16 and responsively close its contacts, thereby connecting each of the windings first terminals T1, T2, T3 to the respective power lines L1, L2, L3. A run contactor 32 in the form of a second three pole contactor has its contacts 34 connected between the motor winding second terminals T4, T5, T6 and the power supply 20. The run contactor 32 is adapted to receive a run signal from the control module 16 and responsively close its contacts 34 to connect each of the motor windings second terminals T4, T5, T6 to the respective line L2, L3, L1 from the three-phase power source 20.

A shorting contactor 38 in the form of a third three pole contactor, has its contacts 42 connected between the motor windings second terminals T4, T5, T6 and the point of common potential 46. The shorting contactor 38 is adapted to receive a short signal from the control module and responsively close the shorting contacts 42, thereby connecting the motor windings second terminal T4, T5 and T6 at the same potential.

The control module 16 is programmed to energize the motor 18 in a wye-delta configuration by simultaneously closing the contacts for the start and short contactors 24, 38, and then energizing the motor in a delta configuration by simultaneously closing the contacts of the start and run contacts 24, 32. A mechanical linkage 50 between the run contactor 32 and the shorting contactor 38 preferably prevents the simultaneous closure of these contactors.

The starter circuit 17 further includes three transition resistors 54 which are used to keep the motor windings energized with the power lines during transition from the wye configuration to the delta configuration to limit transition current in rush. Each transition resistor 54 has a first terminal connected to a junction of a starter contact 28 and a first terminal T1, T2, T3 and a second terminal connected to a different one of the second terminals T4, T5, T6 through respective transition contacts 56. A transition contactor 58 is adapted to receive a transition signal from the control module 16 and responsively close the transition contacts 56. During transition, the contacts of the transition contactor 58, the start contactor 24 and the shorting contactor 38 are initially closed such that each of the transition resistors 54 is in parallel with the windings of a different one of the motor phases. Subsequently, the shorting contactor 38 is de-energized to connect the transition resistors in series with the motor windings. The run contactor 32 is then closed, thereby shorting around the transition resistors 54 and energizing the motor at full line potential. The transition contactor 58 is then de-energized, thereby opening up the contactor 56 and removing the transition resistors 54 from the circuit.

A current sensing means 62 is provided for sensing the current flow through the motor windings and responsively producing respective winding current signals. The current sensing means 62 is in the form of three current transformers 64A–C, each of which is adapted to sense the current flowing through the windings of a different motor phase and responsively produce a respective winding current signal.

The tester 10 includes a microprocessor 80 of conventional nature and the tester 10 is connected by an electrical connection 82 to a communication interface 84 which allows the tester 10 to communicate and control the control module 16. The tester 10 may include its own link to remote devices by means of a connection 86. The tester 10 is also connected to a controllable low power source 88 by a control line 90 which allows the tester 10 to selectively apply power to one, some or all of the lines L1, L2 and L3 and thereby test motor terminal connections in conjunction with module 16 and the fixture 100.

In FIG. 1, the tester 10 is connected to a motor test fixture 100 is, in turn, physically and electrically connected to the terminals T1 through T6 so as to provide an electrical connection 102 from the terminal T1 to T6 to the tester 10. The details of the test fixture 100 are shown in FIGS. 2–6.

Figure 2:
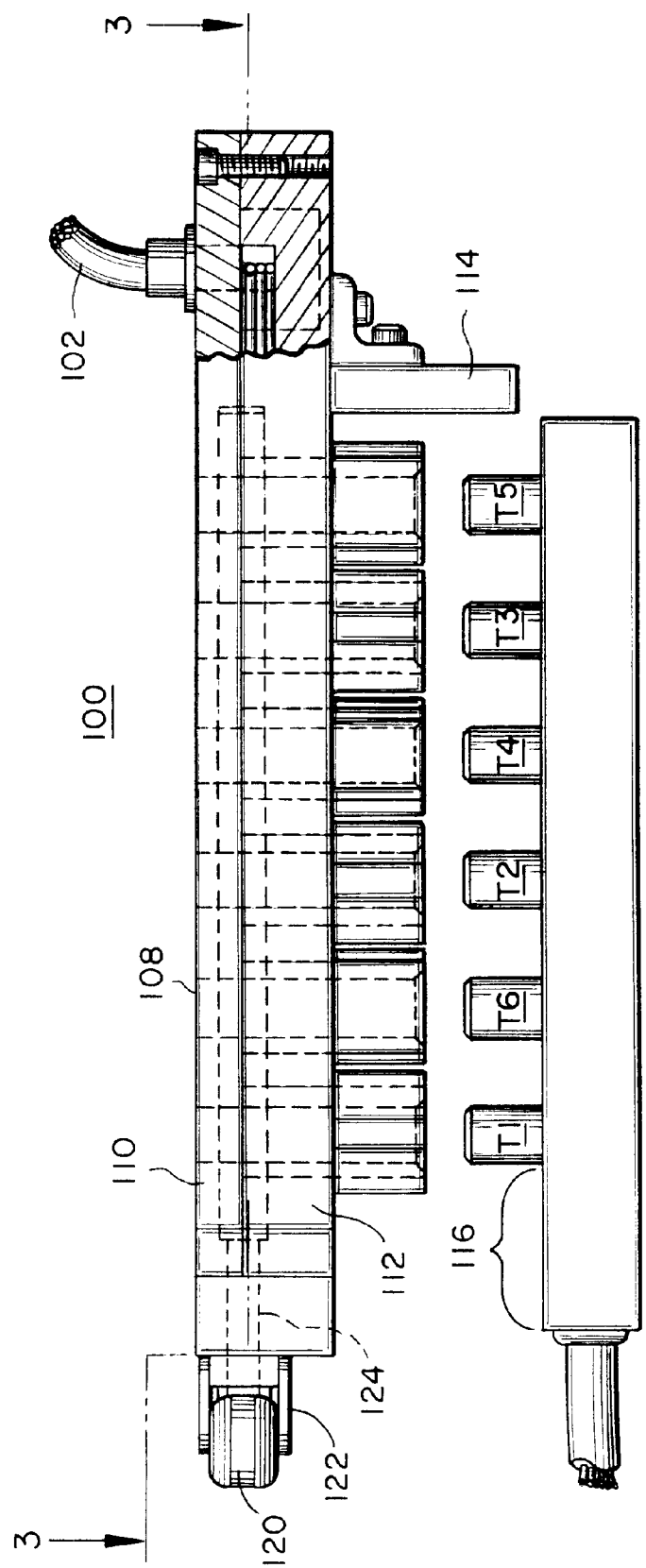
FIG. 2 is a side view of the present invention.
Figures 3, 4:
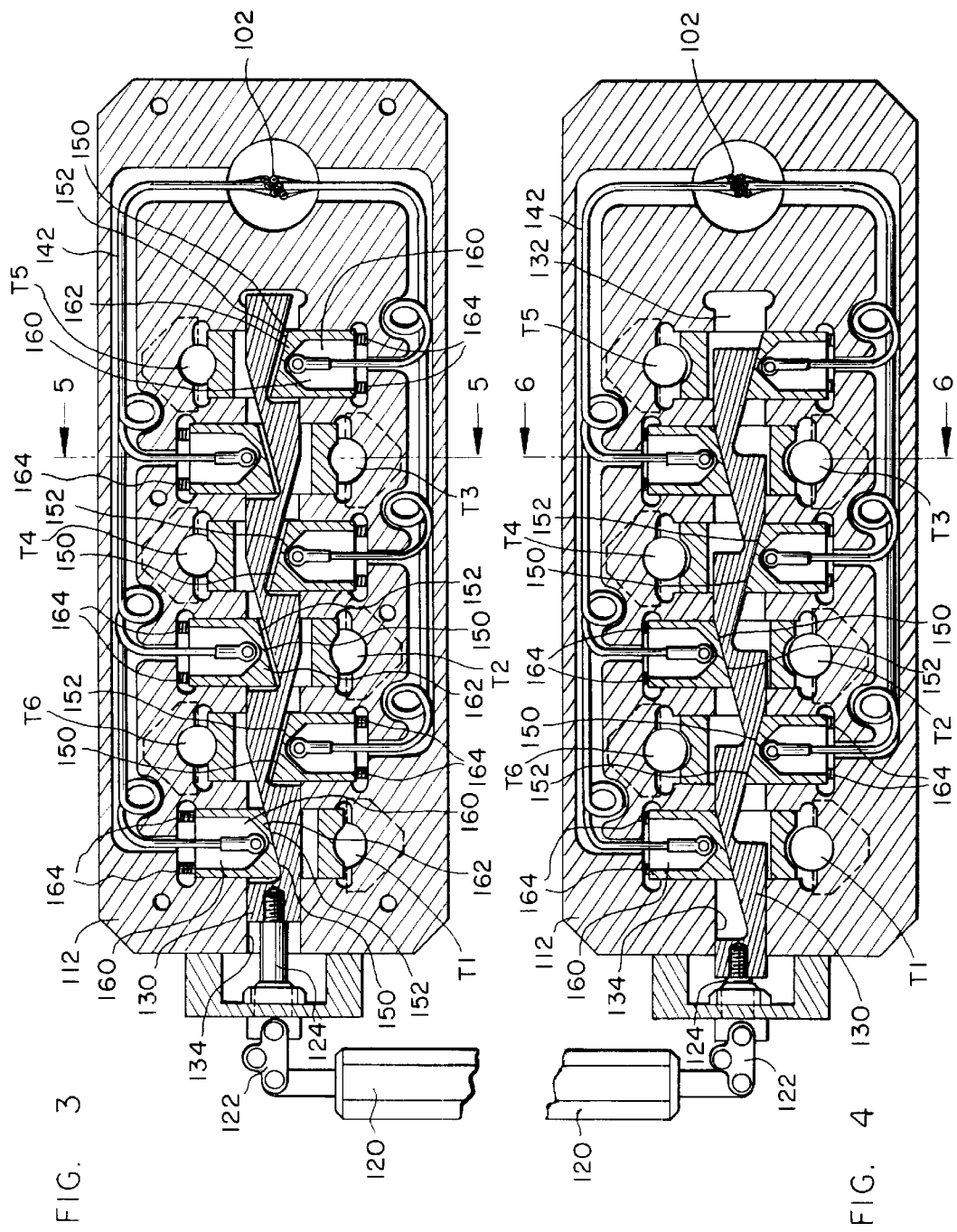
FIG. 3 is a diagrammatic illustration of the present invention in a lug engagement position.
FIG. 4 is a diagrammatic illustration of the present invention in a lug disengagement position.

Specifically referring to FIG. 2, the test fixture 100 includes a housing 108 preferably formed in a upper portion 110 and a lower portion 112. The lower portion 112 includes a protrubence 114 which functions as a polarity bar. The protrubence 114 ensures that the test fixture 100 can only be connected to terminals T1 through T6 in one orientation. In the other possible orientations, the protrudence 114 will be obstructed by an area 116 which may comprise cabling, molding, or other devices to block the protrudence 114. As best shown in FIGS. 3 and 4, the housing 108 includes a handle 120 connected by a pivoting device 122 and a pin 124 to a slide bar 130. Support 126 provides a pivot axis for the handle 120 and the device 122. The slide bar 130 is contained within a chamber 132 of the housing 110. An external aperture 134 in the housing 108 provides an access to the chamber 132 and allows connection between the handle 120 and the slide bar 130. Other means of connection are contemplated including having the slide bar extend or project past the external aperture 130, or threading mounting the slide bar 130 within the chamber 132 and providing an inset hex head or screw fitting in the slide bar 130 to allow a tool to turn or move the slide bar 130. The external aperture 134, the chamber 132 and the slide bar 130 preferably have the same cross-sectional shape, preferably rectangular, so as to allow the slide bar 130 to slide in the chamber 132.

Figure 5:
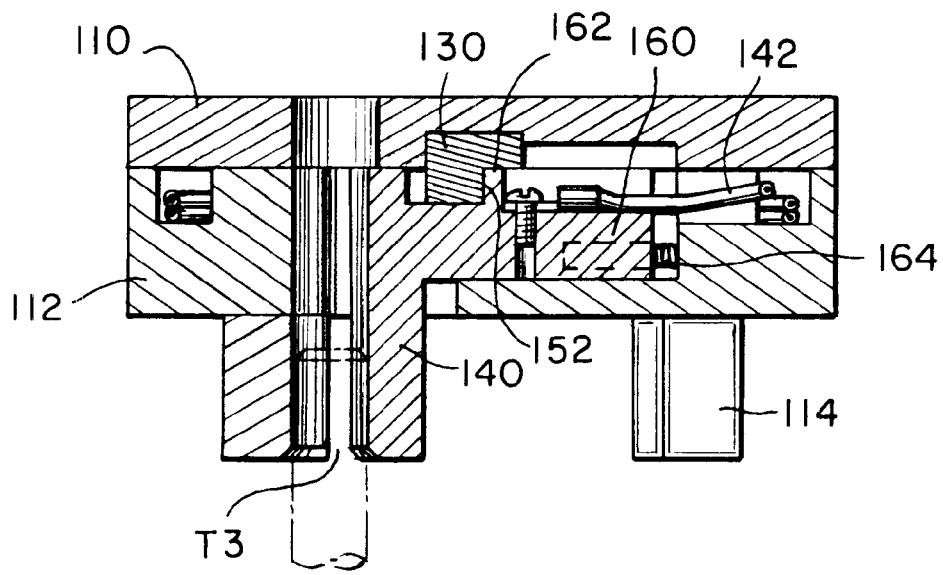
FIG. 5 is a side sectional view of the lug engagement position of FIG. 3 taken along lines 5–5.

FIGS. 3 and 5 show the slide bar in a lug engagement position wherein a plate 140, preferably lying in a plane, contacts the terminals T1, T2, T3, T4, T5 and T6 providing both physical and electrical contact and creating a electrical path through the appropriate terminal (T3 in FIG. 5), the plate 140 and a cable 142, the cable 142 comprising a subcable of cable 102.

The slide bar 130 includes a plurality of plate motivators 150, each plate motivator 150 preferably machined in the slide bar 130 to include a sloped or ramped portion 152. The plate 140 is formed as part of a moveable contact post 160 which includes a contact projection or protrusion 162. The post 160 is preferably perpendicular to the plate although other arrangements are contemplated. Springs 164 are provided to urge the post 160 into the lug engagement position and will do so unless their spring force is overcome by the ramp portion 152 of the slide bar 130. Other compression arrangements can replace the springs 164, and a person of ordinary skill in the art will appreciate that the biasing arrangement of the invention would be reversed so that the plate motivators urge electrical connection and the springs bias to disengagement.

Figure 6:
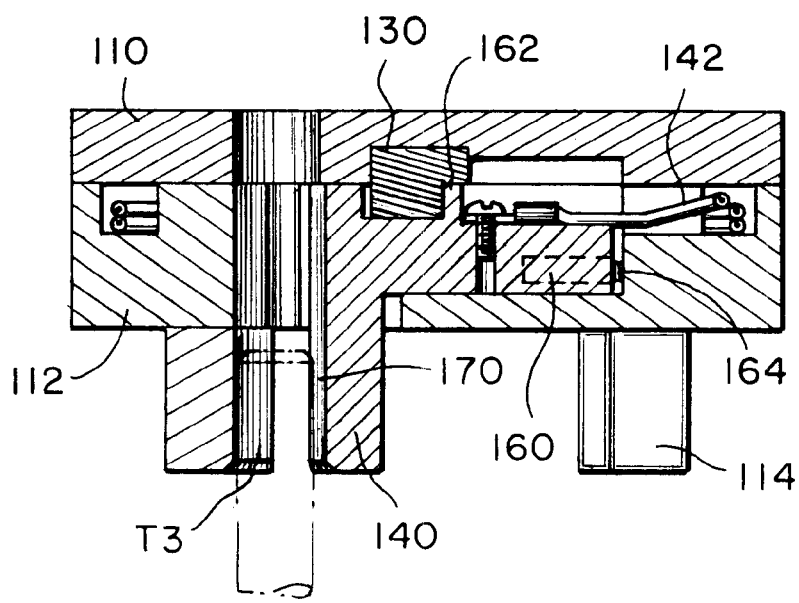
FIG. 6 is a side sectional view of the lug disengagement position of FIG. 4 taken along line 6–6.

When the slide bar 130 is moved to the lug disengagement position shown in FIGS. 4 and 6, the sloped ramp portion 152 engages the projection 162, overcomes the spring force of the springs 164 and urges the post 160 away from the terminal T3 (or T1, T2, T4, T5 or T6 as appropriate) and moves the plate 140 out of physical and electrical contact with the terminal T3. This leaves a gap 170 between the plate 140 and the terminal T3 (or T1, T2, T4, T5 or T6 as appropriate) and breaks the electrical path.

In operation the terminal fixture 100 has its handle 120 in the disengaged position of FIG. 4. The terminal fixture 100 is placed over the terminals T1 through T6 and the handle 120 moved to the position shown in FIGS. 3 and 5. Moving the handle 120 causes the slide bar 130 to slide and force the plate motivators 150 and the ramped portion 152 to engage the contact projections 162. Effectively, this causes the slide bar to move from the lug disengagement position of FIGS. 4 and 6 to the lug engagement position shown in FIGS. 3 and 5. Moving the handle 120 from the position shown in FIG. 4 to the position shown in FIG. 3 urges the slide bar from a first position shown in FIG. 4 to a second position shown in FIG. 3. The plate motivators 150 and the ramped portion 152 basically move out of engagement with the projections 162. This allows the springs 164 to move the posts 160 and the plates 140 into electrical and physical contact with the respective terminals T1–T6. This creates the desired electrical connection and allows the tester 10 by itself and by means of the control module 16 to run various continuity tests and to pass low voltage electrical signals to verify the correct wiring to and operation of the motor terminal connections.

Thus what has been described as a motor terminal test fixture that allows easy and accurate connection to motor terminals. It will be apparent to a person of ordinary skill in the art that various modifications and alterations can be implemented. All such modifications and alterations are contemplated to fall within the spirit and scope of the present invention.

What is desired to be secured as letters patent is set forth in the following claims.

What is claimed is:

1. A motor test fixture for connection to motor terminal lugs, comprising:
    a housing including a plurality of external apertures positioned and formed to enclose the motor terminal lugs;
    an aperture in the housing;
    a chamber within the housing having a first end open to the aperture;
    a slide bar moveably located in the chamber and moveable between at least a first position and a second position;
    a plurality of plates moveably mounted in the housing to move between a motor lug engagement position and a motor lug disengagement position;
    a plurality of plate motivators, each plate motivator arranged on the slide bar to engage a respective one of the plates and, when the slide bar is in the first position, to motivate the respective plate to the lug disengagement position and, when the bar is in the second position, to motivate the respective plate to the lug engagement position;
    wherein the plate motivators include a first set of plate motivators on a first side of the slide bar and a second set of plate motivators arranged on a second opposite side the slide bar; and
    wherein the plurality of plates each include a plate portion lying generally in a plane, a post portion extending generally perpendicular to said plane and connected at a post first end, and a protrusion arranged from the post at a second post end.

2. The motor test fixture of claim 1 wherein the protrusion engages a respective plate motivator in the lug disengagement position.

3. The motor test fixture of claim 2 further including a polarity bar on the housing which ensures that the motor test fixture can only be connected to the motor terminal lugs in one orientation.

4. The motor test fixture of claim 3 wherein the aperture, the chamber, and the slide bar have the same cross sectional shape.

5. The motor test fixture of claim 1 further including a polarity bar on the housing which ensures that the motor test fixture can only be connected to the motor terminal lugs in one orientation.

6. A motor test fixture for connection to motor terminal lugs, comprising:
    a housing including a plurality of external apertures positioned and formed to enclose the motor terminal lugs;
    an aperture in the housing;
    a chamber within the housing having a first end open to the aperture;
    a slide bar moveably located in the chamber and moveable between at least a first position and a second position;
    a plurality of plates moveably mounted in the housing to move between a motor lug engagement position and a motor lug disengagement position;

a plurality of plate motivators, each plate motivator arranged on the slide bar to engage a respective one of the plates and, when the slide bar is in the first position, to motivate the respective plate to the lug disengagement position and, when the bar is in the second position, to motivate the respective plate to the lug engagement position; and wherein the aperture, the chamber, and the slide bar have the same cross sectional shape.

7. A slide bar comprising:

a longitudinally extending bar; and a plurality of plate motivators integrally formed in the bar including a first set of plate motivators on a first side of the slide bar and a second set of plate motivators arranged on the second, opposite side of the slide bar, each plate motivator including a sloped portion; and an attachment pin fixedly attached to a first end of the slide bar.

8. The slide bar of claim 7 further including a handle in pivotal arrangement operably connected to the pin.

9. A motor test fixture system comprising:

a plurality of motor terminal lugs providing electrical connection to a motor and motor start contactors;

a housing including a plurality of external apertures positioned and formed to enclose the motor terminal lugs;

a longitudinal chamber arranged within the housing and having a first chamber end and a second chamber end;

a longitudinal slide bar arranged in the chamber and having a first bar end and a second bar end, the slide bar being moveable to a first position near the first chamber end and a second position nearer the second chamber end;

a plurality of plates moveably positioned in the housing to move between a motor lug engagement position where the plates respectively contact a motor lug and a motor lug disengagement position where the plates do not contact the respective motor lug;

a plurality of plate motivators, each plate motivator being operatively associated with the slide bar to engage a respective one of the plates when the slide bar is in the first position and to motivate the respective plate to the lug disengagement Position; and wherein the plurality of plate motivators each include a spring mechanism urging the respective plate to the lug engagement position.

10. The system of claim 9 further including a polarity bar on the housing which ensures that the motor test fixture can only be connected to the motor terminal lugs in one orientation.

11. The system of claim 9 wherein the plate motivators include a first set of plate motivators on a first side of the slide bar and a second set of plate motivators arranged on a second opposite side the slide bar.

12. A motor test fixture system comprising:

a plurality of motor terminal lugs providing electrical connection to a motor and motor start contactors;

a housing including a plurality of external apertures positioned and formed to enclose the motor terminal lugs;

a longitudinal chamber arranged within the housing and having a first chamber end and a second chamber end;

a longitudinal slide bar arranged in the chamber and having a first bar end and a second bar end, the slide bar being moveable to a first position near the first chamber end and a second position nearer the second chamber end;

a plurality of plates moveably positioned in the housing to move between a motor lug engagement position where the plates respectively contact a motor lug and a motor lug disengagement position where the plates do not contact the respective motor lug;

a plurality of plate motivators, each plate motivator being operatively associated with the slide bar to engage a respective one of the plates when the slide bar is in the first position and to motivate the respective plate to the lug disengagement position; and wherein the aperture, the chamber, and the slide bar have the same cross sectional shape.

13. A motor test fixture system comprising:

a plurality of motor terminal lugs providing electrical connection to a motor and motor start contactors;

a housing including a plurality of external apertures positioned and formed to enclose the motor terminal lugs;

a longitudinal chamber arrange in the housing and having a first chamber end and a second chamber end;

a longitudinal chamber arrange in the chamber and having a first bar end and a second bar end, the slide bar being moveable to a first position near the first chamber end and a second position nearer the second chamber end;

a plurality of plates moveably positioned in the housing to move between a motor lug engagement position where the plates respectively contact a motor lug and a motor lug disengagement position where the plates do not contact the respective motor lug;

a plurality of plates movably positioned in the housing to move between a motor lug engagement position where the plates respectively contact a motor lug and a motor lug disengagement position where the plates do not contact the respective motor lug;

a plurality of plate motivators, each plate motivator being operatively associated with the slide bar to engage a respective one of the plates when the slide bar is in the first position and to motivate the respective plate to the lug disengagement position; and wherein the plurality of plates each include a plate portion lying generally in a plane, a post portion extending generally perpendicular to said plane and connected at a post first end, and a protrusion arrange from the post at a second post end.

14. The system of claim 13 wherein the protrusion engages a respective plate motivator in the lug disengagement position.

15. The system of claim 14 further including a polarity bar on the housing which ensures that the motor test fixture can only be connected to the motor terminal lugs in one orientation.

16. The system of claim 15 wherein the aperture, the chamber, and the slide bar have the same cross sectional shape.

17. A method of connecting a motor test fixture to motor terminal lugs comprising the steps of:

placing external apertures in the motor terminal test fixture over a plurality of motor terminal lugs;

slideably moving a slide bar within a chamber in the test fixture from a first position to a second position;

responsive to the slide bar movement, sliding a plurality of plates moveably mounted in the housing from a motor lug disengagement position to a motor lug engagement position; and providing a plurality of plate motivators associated with each of said plurality of plates respectively urging the respective plate to the lug disengagement position when the slide bar is in the first position and motivating the respective plate to the lug engagement position when the slide bar is in the second position.

18. The method of claim 17 including the further steps of providing a first set of plate motivators on a first side of the slide bar and a second set of plate motivators on a second opposite side of the slide bar.

19. The method of claim 17 including a plate protrusion associated with each of said plurality of plates and including the further step of engaging a plate motivator with the protrusion in the lug disengagement position.

20. The method of claim 19 including the further step of using the plurality R on the housing to ensure that the motor test fixture can only be connected to the motor terminal lugs in one orientation.

21. The arrangement of claim 19 further including means for using the plurality R on the housing to ensure that the motor test fixture can only be connected to the motor terminal lugs in one orientation.

22. The arrangement of claim 17 further including means for providing a first set of plate motivators on a first side of the slide bar and a second set of plate motivators on a second opposite side of the slide bar.

23. The arrangement of claim 17 including a plate protrusion associated with each of said plurality of plates and means for engaging a plate motivator with the protrusion in the lug disengagement position.

24. An arrangement for connecting a motor test fixture to motor terminal lugs comprising the steps of:

means for placing external apertures in the motor terminal test fixture over a plurality of motor terminal lugs;

means for slideably moving a slide bar within a chamber in the test fixture from a first position to a second position;

means, responsive to the slide bar movement, for sliding a plurality of plates moveably mounted in the housing from a motor lug disengagement position to a motor lug engagement position; and means for providing a plurality of plate motivators associated with each of said plurality of plates respectively urging the respective plate to the lug disengagement position when the slide bar is in the first position and motivating the respective plate to the lug engagement position when the slide bar is in the second position.

* * * * *

UNITED STATES PATENT AND TRADEMARK OFFICE
CERTIFICATE OF CORRECTION

PATENT NO. : 6,577,131 B2
DATED : June 10, 2003
INVENTOR(S) : Matthew A. Shepeck, Brenda K. Bricco and Brady J. Moroney It is certified that error appears in the above-identified patent and that said Letters Patent is hereby corrected as shown below:

Column 7,
Line 45, delete "Position" and insert -- position --.

Column 8,
Line 23, delete "arrange in" and insert -- arranged within --.
Line 25, delete "chamber" and insert -- slide bar --.
Line 25, delete "arrange" and insert -- arranged --.
Delete lines 34 through 38.

Signed and Sealed this

Twenty-fifth Day of November, 2003

JAMES E. ROGAN
*Director of the United States Patent and Trademark Office*